(12) United States Patent
Sasaki et al.

(10) Patent No.: US 6,573,511 B2
(45) Date of Patent: Jun. 3, 2003

(54) ELECTRON BEAM IRRADIATION SYSTEM AND ELECTRON BEAM IRRADIATION METHOD

(75) Inventors: Jun Sasaki, Tokyo (JP); Yuichi Aki, Tokyo (JP); Yoshihisa Miura, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/083,383

(22) Filed: Feb. 27, 2002

(65) Prior Publication Data

US 2002/0117636 A1 Aug. 29, 2002

(30) Foreign Application Priority Data

Feb. 28, 2001 (JP) ........................................ 2001-054741

(51) Int. Cl.[7] .............................. G01K 5/10; G21K 5/10; G21K 7/00; G21G 5/00; G01N 23/00
(52) U.S. Cl. ............................... 250/441.11; 250/492.2; 250/492.3; 250/307; 250/310
(58) Field of Search ...................... 250/442.11, 440.11, 250/441.11, 311, 400, 433, 437, 453.11, 454.11, 455.11, 307, 310, 492.2, 492.3

(56) References Cited

U.S. PATENT DOCUMENTS

| | | | | |
|---|---|---|---|---|
| 4,033,904 A | * | 7/1977 | Gerlach et al. | 250/440.11 |
| 4,376,891 A | * | 3/1983 | Rauscher et al. | 250/307 |
| 5,378,984 A | * | 1/1995 | Kurata et al. | 250/310 |
| 5,418,092 A | * | 5/1995 | Okamoto | 430/311 |
| 5,561,299 A | * | 10/1996 | Ishida et al. | 250/442.11 |
| 5,646,403 A | * | 7/1997 | Mori et al. | 250/310 |
| 5,780,853 A | * | 7/1998 | Mori et al. | 250/310 |
| 6,320,195 B1 | * | 11/2001 | Magome | 250/442.11 |
| 6,366,688 B1 | * | 4/2002 | Jun et al. | 250/306 |
| 2001/0052577 A1 | * | 12/2001 | Aki et al. | 250/492.2 |
| 2002/0033449 A1 | * | 3/2002 | Nakasuji et al. | 250/306 |
| 2002/0036264 A1 | * | 3/2002 | Nakasuji et al. | 250/306 |
| 2002/0088940 A1 | * | 7/2002 | Watanabe et al. | 250/310 |
| 2002/0109088 A1 | * | 8/2002 | Nara et al. | 250/306 |

FOREIGN PATENT DOCUMENTS

| | | |
|---|---|---|
| EP | 1 152 417 A2 | 11/2001 |
| JP | 4-58517 | 2/1992 |
| JP | 4-359506 | 12/1992 |
| JP | 9-293477 | 11/1997 |
| JP | 11-328750 | 11/1999 |

\* cited by examiner

*Primary Examiner*—John R. Lee
*Assistant Examiner*—Bernard E. Souw
(74) *Attorney, Agent, or Firm*—Rader, Fishman & Grauer PLLC; Ronald P. Kananen

(57) ABSTRACT

A focusing stage is provided on a slide table of a support mechanism portion on which a master is supported, at a position adjacent to the master. At the time of recording, first, the focusing stage is irradiated with an electron beam to thereby focus the electron beam, and thereafter recording is conducted by irradiating the master with the electron beam.

10 Claims, 5 Drawing Sheets

ELECTRON BEAM IRRADIATION SYSTEM AND ELECTRON BEAM IRRADIATION METHOD

BACKGROUND OF THE INVENTION

The present invention relates to an electron beam irradiation system and an electron beam irradiation method, which are used, for example, for recording on a master of optical disks.

In recent years, there has been a demand for a higher recording density on optical disks, and, for realizing this, it is necessary to form recording pits more finely.

Therefore, in the manufacture of a master of optical disks, there has been proposed a system of recording by irradiation with an electron beam, with which finer pits can be formed than with a conventional laser light.

In the system of recording by irradiating the master with the electron beam, it is necessary to accurately focus the electron beam on the master for enabling high-precision recording.

Hitherto, as an electron beam irradiation system comprising a means for focusing an electron beam, there has been known the system shown in FIG. 1.

Namely, in this system, a reversing table 41 is provided in a vacuum vessel 40 so that it can be rotated by a reversing mechanism 42, a motor 43 is fixed on one end side of the reversing table 41, a master 45 is mounted on a turn-table 44 fitted to a rotary shaft of the motor 43, and the master 45 is irradiated with an electron beam emitted from an electron beam irradiation means 46 to achieve recording.

In this system, a focusing stage 47 for focusing the electron beam is provided on the other end side of the reversing table 41, namely, at an end portion on the opposite side of the turn-table 44 with respect to the center of rotation of the reversing table 41.

The focusing stage 47 has its upper surface set at the same height with the master 45 mounted on the turn-table 44. At the time of recording on the master 45, first, the focusing stage 47 is made to correspond to the electron beam irradiation means 46, and, in this condition, the upper surface of the focusing stage 47 is irradiated with the electron beam, and focusing of the electron beam is conducted by the electron beam irradiation means 46. Thereafter, the reversing table 41 is rotated 180° (reversed) by the reversing mechanism 42 so that the master 45 corresponds to the electron beam irradiation means 46, and the master 45 is irradiated with the electron beam to perform recording.

However, the conventional electron beam irradiation system constituted as above has the following problems.

Namely, the conventional system has a construction such that the master and the focusing stage are moved by reversing, so that the distance between the master and the focusing stage is large, and it is difficult to maintain both of them at the same height accurately.

Therefore, with the conventional system, it is difficult to accurately focus the electron beam on the master, and there is a question as to realization of high-precision recording.

SUMMARY OF THE INVENTION

The present invention has been made to solve the above-mentioned problems of the related art. Accordingly, it is an object of the present invention to make it possible to focus an electron beam on a body to be irradiated, for example, a master of optical disks, easily and accurately, and to enable high-precision recording on the master.

In order to attain the above object, the present invention provides an electron beam irradiation system including:

a support mechanism portion having a slide table for supporting a master (a body to be irradiated) to be irradiated with an electron beam so that the master can be rotated and moved in a radial direction, and an electron beam irradiation means for irradiating the master with the electron beam while partially establishing a vacuum condition on the master, wherein a focusing stage for focusing the electron beam is stationarily disposed on the slide table of the support mechanism portion at a position adjacent to the master.

In the electron beam irradiation system, focusing of the electron beam is conducted by irradiating the focusing stage with the electron beam before performing recording on the master. Thereafter, the slide table is moved to an electron beam irradiation starting position for the master, and recording is conducted by irradiating the master with the electron beam.

In the electron beam irradiation system according to the present invention, the distance between the master and the focusing stage is short, which is advantageous in view of precision in adjusting the height of the focusing stage to the height of the master. Therefore, it is possible to accurately focus the electron beam on the master and to achieve high-precision recording.

As described above, according to the present invention, the electron beam irradiation system of a partial vacuum system in which only the portion for irradiation with the electron beam is in a vacuum can easily and accurately perform focusing of the electron beam to the body to be irradiated by disposing a focusing stage at a position adjacent to the body to be irradiated on the slide table for supporting the body to be irradiated. Consequently, where the body to be irradiated is a master optical disk, the electron beam irradiation system can perform high-precision recording.

The above and other objects, features and advantages of the present invention will become apparent from the following description and appended claims, taken in conjunction with the accompanying drawings, which show by way of example some preferred embodiments of the invention.

DETAILED DESCRIPTION OF THE PREFERRED EMBODIMENTS

Figure 1:
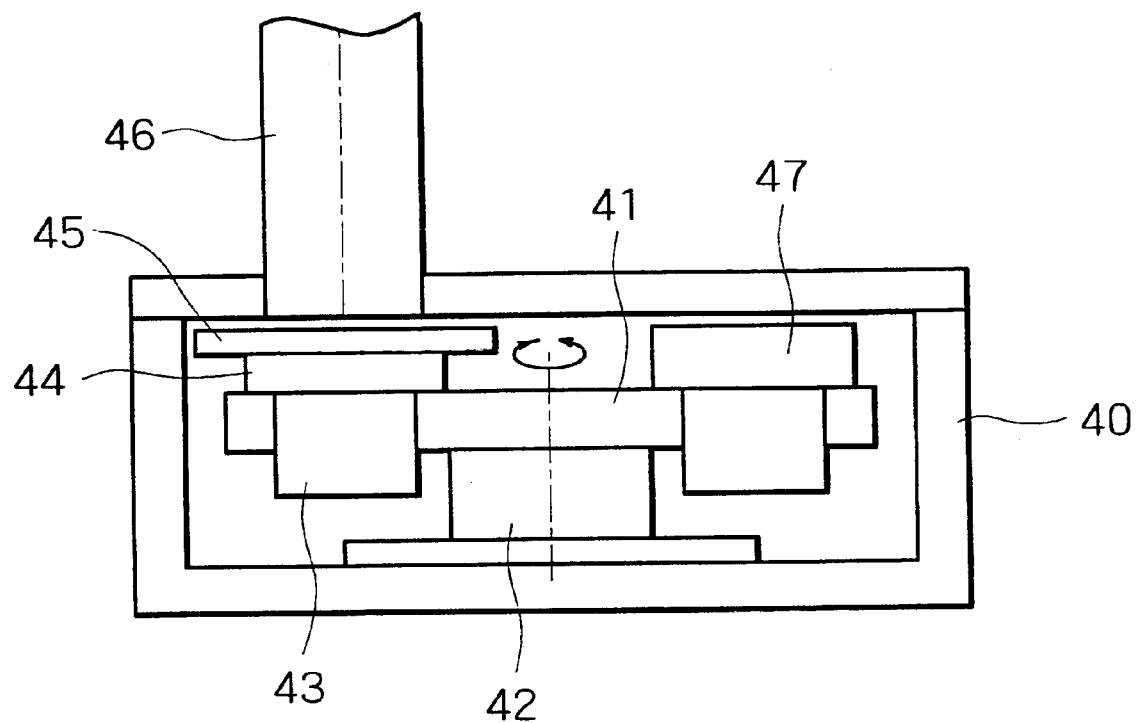
FIG. 1 is an illustration of one example of the related art.

Now, an embodiment of the present invention will be described below and referring to the drawings.

Figure 2:
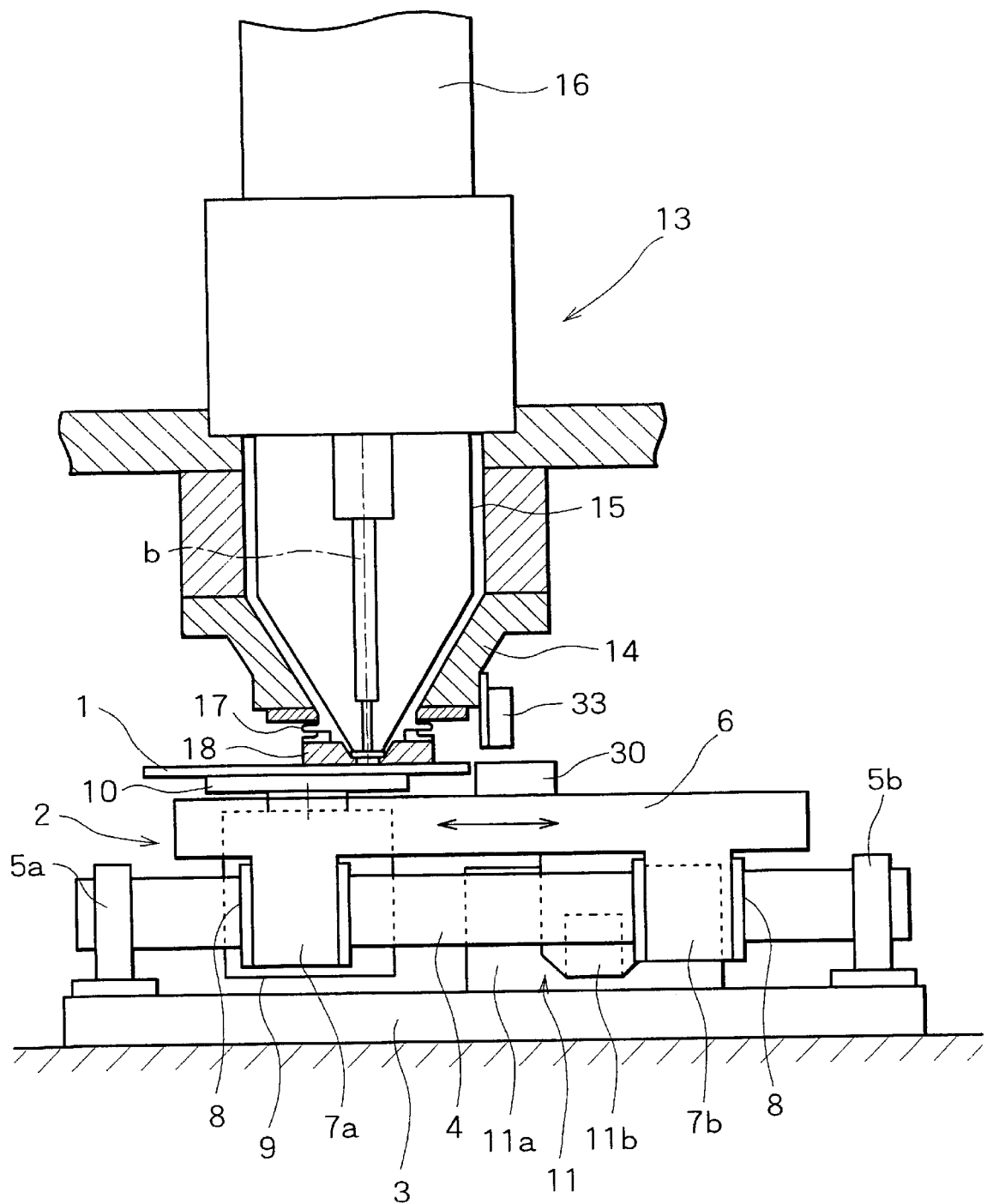
FIG. 2 is a front view of a partial vacuum type electron beam irradiation system to which the present invention is applied.

Here, an electron beam irradiation system used for recording on a master of optical disks is shown as an example. The system, as shown in FIG. 2, is for recording signals (formation of record pits in signal pattern) on a master 1, which is a body to be irradiated, by irradiation with an electron beam b emitted from an electron gun 16.

Here, irradiation with the electron beam requires a vacuum environment, and, particularly, this system adopts a partial vacuum system in which only the portion for irradiation with the electron beam is maintained in a vacuum condition while the other portions are placed in the atmospheric air.

First, a support mechanism portion 2 for supporting the master 1 in the system will be described.

A guide rail 4 is horizontally disposed on a base 3 of the system, its left and right end portions are fixed by fixing portions 5a, 5b, and a slide table 6 is movably supported on the guide rail 4 through bearings 8 provided at left and right leg portions 7a, 7b.

As the bearings 8, static pressure air bearings are used, whereby a highly accurate moving mechanism with extremely little frictional resistance at the time of movement of the slide table 6 can be realized.

A motor 9 which is a rotating means for the master 1 is fixed on the slide table 6, and the master 1 is horizontally mounted on and supported by a turn-table 10 fitted to a rotary shaft of the motor 9.

The motor 9 for rotating the master 1 is an electromagnetic driving type spindle motor, which is driven based on a control signal supplied from a control circuit, whereby the master 1 is rotated as one body with the turn-table 10.

Here, the motor 9 adopts a static pressure air type bearing as a bearing for the rotary shaft thereof, and a highly accurate rotating mechanism with little load due to frictional resistance at the time of rotation and with good response properties can be realized.

In this system, a vacuum suction system is adopted as a chucking system for stationarily holding the master 1 on the turn-table 10.

Further, a motor 11 which is a moving means for the slide table 6 is disposed between the slide table 6 and the base 3.

The motor 11 for moving the slide table 6 is an electromagnetic driving type linear motor. Namely, a magnetic circuit of a voice coil type, for example, is provided between a stator 11a on the side of the base 3 and a moving element 11b on the side of the slide table 6, and the motor 11 is driven based on a control signal from the control circuit, whereby the slide table 6 is moved horizontally along the guide rail 4, and the master 1 is moved in a radial direction thereof as one body with the slide table 6.

On the upper side of a support mechanism portion 2 for the master 1 constituted as above, there is fixed an electron beam irradiation means 13 for irradiation with an electron beam while the upper side of the master 1 is partially maintained in a vacuum state.

Numeral 14 denotes a vacuum chamber hangingly supported on the upper side of the master 1. An electron beam column 15 is disposed inside of the vacuum chamber 14, and an electron beam b is emitted from an electron gun 16 which is an electron beam excitation source on the upstream side of the electron beam column 15.

An exhaust means consisting of a vacuum pump is connected to the vacuum chamber 14 incorporating the electron beam column 15 therein. Suction is applied to the inside of the vacuum chamber 14 by the exhaust means, whereby the inside of the electron beam column 15 is maintained at a vacuum degree (about $1 \times 10^{-4}$ Pa) substantially suitable for irradiation with the electron beam.

A static pressure floating pad 18 is fitted to an electron beam outlet at a lower end portion of the vacuum chamber 14 through an expansion-contraction connection mechanism 17. The static pressure floating pad 18 is floated in a noncontacting state from the master 1 with a minute gap of about 5 $\mu$m therebetween, and, in this condition, the electron beam b emitted from the electron gun 16 passes through an electron beam passage at a central portion of the static pressure floating pad 18 to impinge upon the master 1.

Figure 3:
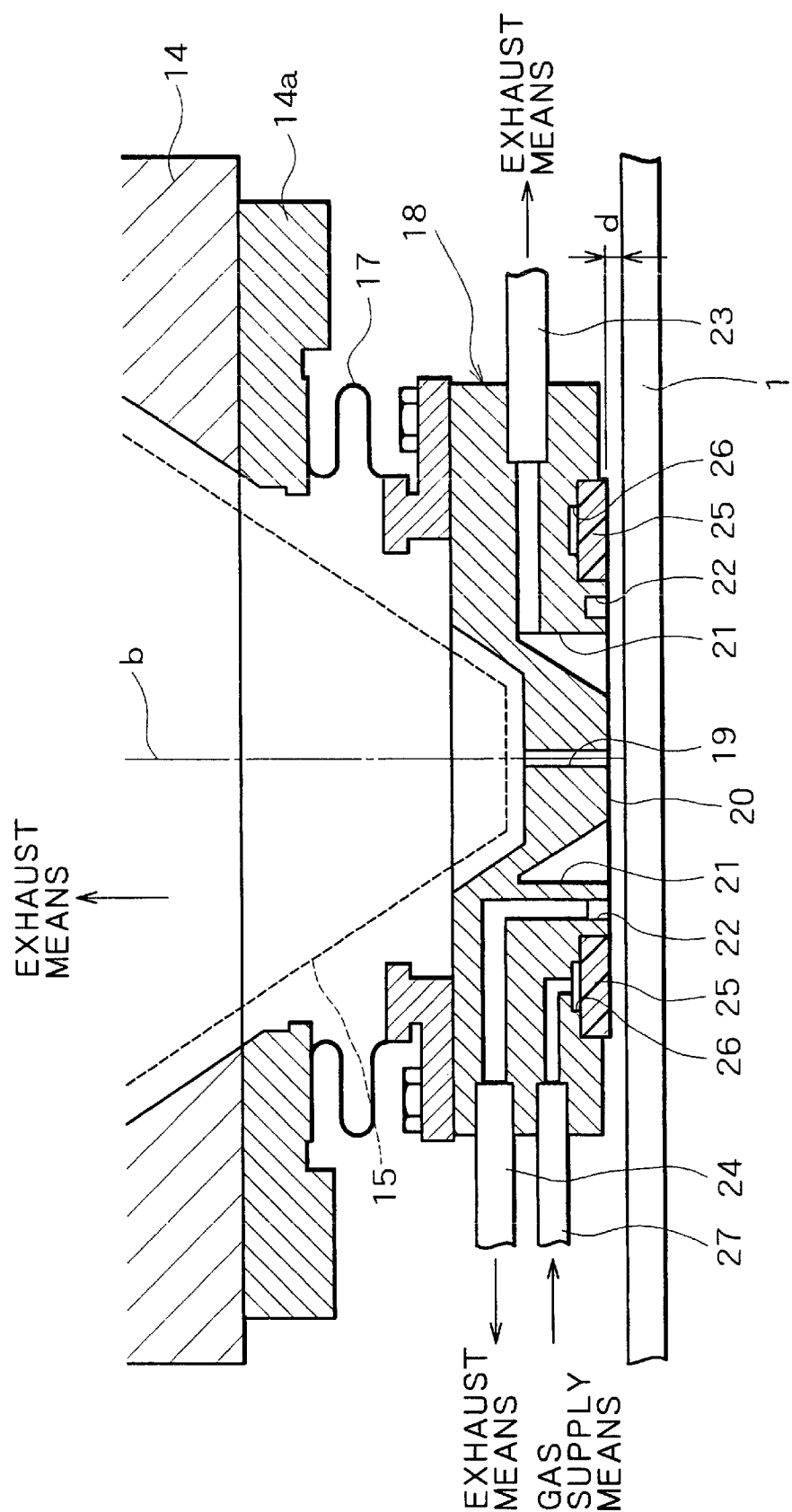
FIG. 3 is a vertical sectional view showing the structure of a static pressure floating pad provided in the electron beam irradiation system.

FIG. 3 shows a detailed structure of the static pressure floating pad 18.

The static pressure floating pad 18 is comprised of, for example, a metallic block 20 provided with an electron beam passage 19 for passage of the electron beam b therethrough at a central portion thereof. The block 20 is airtightly connected to a fixed portion 14a at the lower end of the vacuum chamber 14 by the bellows-like expansion-contraction connection mechanism 17, and, by the expansion and contraction of the expansion-contraction connection mechanism 17, the block 20 can follow up the master 1 even when the master 1 shows non-uniformity of thickness, swing of rotation or the like, to securely maintain a gap of about 5 $\mu$m therebetween.

As a means for generating a force for attracting the block 20 toward the master 1, the block 20 is provided with a first suction groove 21 and a second suction groove 22 opened to the surface facing to the master 1, concentrically with the electron beam passage 19 as a center.

Exhaust means are connected to the first suction groove 21 and the second suction groove 22, respectively, through exhaust pipes 23 and 24, and exhausting, namely, suction of a gas from the first suction groove 21 and the second suction groove 22 is conducted by the exhaust means.

As the exhaust means, vacuum pumps are used. In this case, vacuum pumps capable of exhausting the suction groove nearer to the electron beam passage 19 to a higher degree of vacuum are connected. Namely, for the first suction groove 21 nearer to the electron beam passage 19, a vacuum pump capable of providing a vacuum degree of, for example, about $1 \times 10^{-1}$ Pa is connected; for the second suction groove 22 on the outer side, a vacuum pump capable of providing a vacuum degree of about $5 \times 10^3$ Pa is connected.

Further, in the block 20, a gas-permeable body 25 exposed to a surface opposed to the master 1 is embedded on the outside of the second suction groove 22. The gas-permeable body 25 is formed of a porous material having gas permeability, in the shape of a ring with the electron beam passage 19 as a center, and a gas passage 26 is provided inside of the block 20 on the back side of the gas-permeable body 25.

A gas supply means is connected to the passage 26 through a gas supply pipe 27, and a compressed gas (positive pressure) of, for example, about $5 \times 10^5$ Pa is supplied from the gas supply means into the passage 26, to be jetted out from the gas-permeable body 25.

When the exhaust means and the gas supply means are operated in the condition where the static pressure floating pad 18 constituted as above is mounted on the master 1, the static pressure floating pad 18 is made to minutely float up from the master 1 by the gas ejected from the gas-permeable body 25, and, simultaneously, a negative pressure is established in the first and second suction grooves 21 and 22 because gas is sucked out of the grooves, and whereby the static pressure floating pad 18 is attracted toward the master 1. Therefore, the static pressure floating pad 18 is floated in a non-contacting state from the master 1 while maintaining a gap d of about 5 μm therebetween, so that the rotation of the master 1 is not hampered.

At this time, the gas jetted out from the gas-permeable body 25 is sucked into the first and second suction grooves 21 and 22 provided in the surrounding of the gas-permeable body 25, so that the gas is prevented from reaching the electron beam passage 19. In this case, the gas from the gas-permeable body 25 is first sucked into the second suction groove 22, and then sucked into the first suction groove 21. Since the suction force is greater in the first suction groove 21 than in the second suction groove 22, a higher degree of vacuum can be attained as the central portion of the static pressure floating pad 18 is approached, whereby the inside of the vacuum chamber 14, namely, the inside of the electron beam column 15 can be maintained at a vacuum degree (about $1 \times 10^{-4}$ Pa) substantially suitable for irradiation with the electron beam.

The master 1 is irradiated with the electron beam b in the condition where a part of the space on the master 1 is maintained in a vacuum by the static pressure floating pad 18, and, simultaneously, the master 1 is rotated by the driving of the motor 9 of the support mechanism portion 2 and the master 1 is moved in a radial direction by the driving of the motor 11, whereby recording on a predetermined track is performed. See also FIG. 2.

In the electron beam irradiation system constituted as above, a partial vacuum system in which only the portion for irradiation with the electron beam is maintained in a vacuum is adopted, so that it is unnecessary to maintain a large space in a vacuum. Therefore, use of a large-type exhaust means (vacuum pump) can be obviated, and the system can be constituted to be small in size and low in cost.

Meanwhile, in this electron beam irradiation system, it is necessary to accurately focus the electron beam on the master in order to enable high-precision recording.

As a means for focusing the electron beam, particularly, in the electron beam irradiation system according to the present embodiment, a focusing stage 30 is stationarily disposed on the slide table 6 of the support mechanism portion 2 for supporting the master 1, as shown in FIG. 2.

Figure 4:
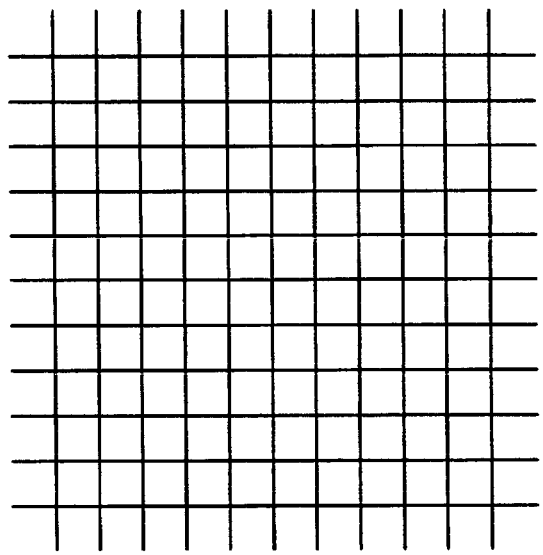
FIG. 4 shows a minute pattern formed on a focusing stage.

The focusing stage 30 is fixed at a position adjacent to the master 1 mounted on the turn-table 10 on the slide table 6 with a minute gap therebetween in the moving direction of the slide table 6, namely, at a position directly on the right of the master 1 in this embodiment. An upper surface of the focusing stage 30 is made to be an electron beam irradiation surface, which is provided with a minute pattern used for focusing of the electron beam. See FIG. 2. As the pattern, a lattice-like pattern as shown in FIG. 4 is preferably used.

In addition, the focusing stage 30 is provided with a height adjusting means for adjusting the height of the electron beam irradiation surface.

As the height adjusting means, there may be mentioned an expansion-contraction mechanism utilizing the pressure of a gas or fluid, an expansion-contraction mechanism utilizing expansion and contraction by passage of an electric current to a piezoelectric device, or the like. Particularly in the case of the former, generation of an electromagnetic field in the focusing stage is absent, so that a bad influence on the irradiation with the electron beam is absent, and, therefore, such a mechanism can be preferably adopted.

Figure 5:
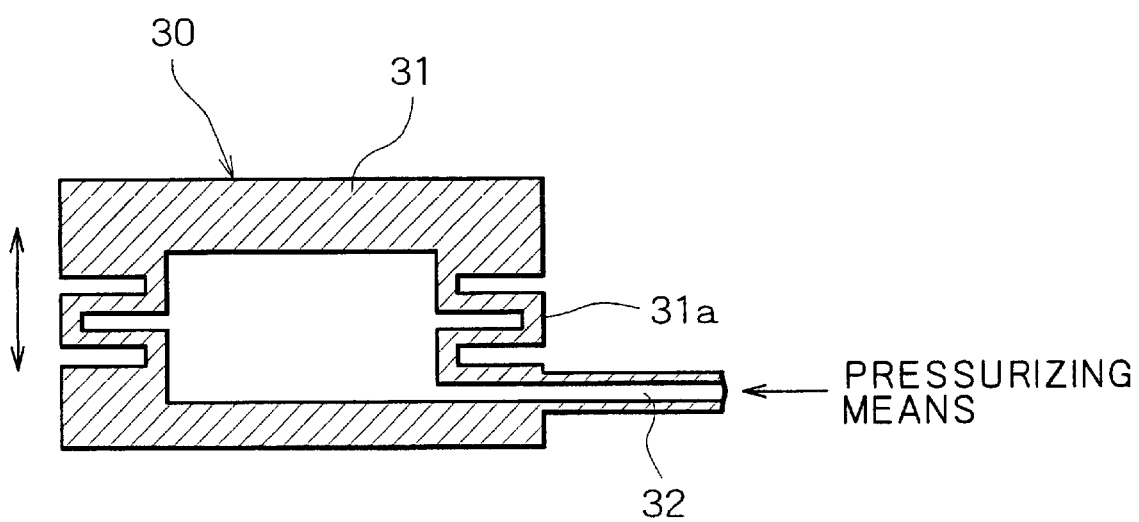
FIG. 5 is a vertical sectional view showing the structure of the focusing stage.

A concrete example of the height adjusting means is shown in FIG. 5.

Namely, in this case, the focusing stage 30 is comprised of a hermetically sealed drum type bellows 31, which can expand and contract in the vertical direction at a flexible portion 31a at its circumferential surface. An external pressurizing means (pump or the like) is connected to the bellows 31 through a conduit 32, and a pressure of a gas or fluid is supplied from the pressurizing means into the bellows 31, whereby the bellows 31 is expanded or contracted to perform an adjustment of the height of the focusing stage 30.

Figure 6A:
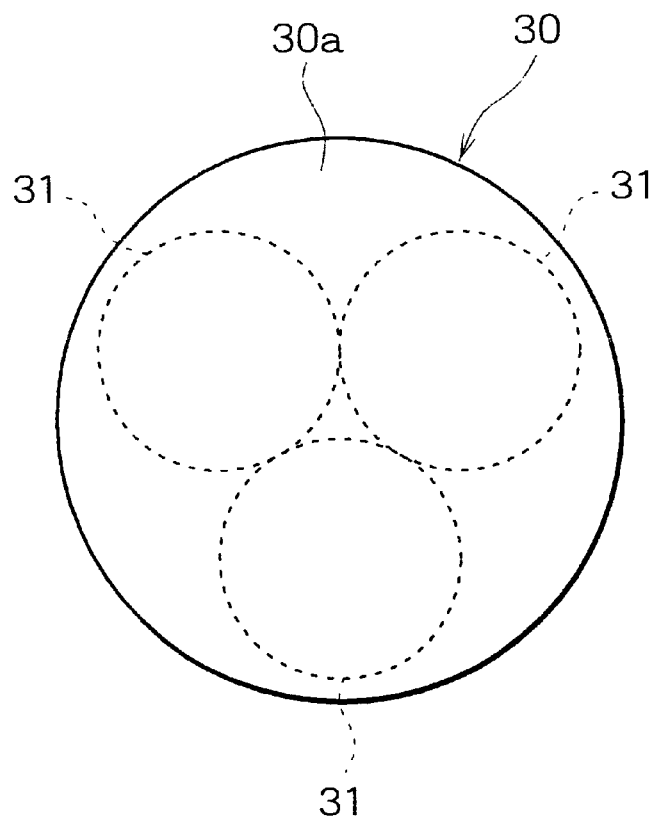
FIGS. 6A and 6B show another example of the focusing stage, in which 6A is a plan view, and 6B is a side view.
Figure 6B:
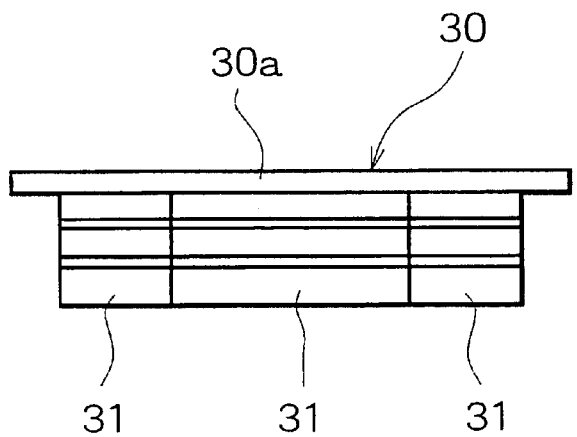

FIGS. 6A and 6B show an example of the focusing stage in which three bellows are used. Namely, in this example, an upper surface plate 30a to be irradiated with the electron beam is supported by three bellows 31 disposed in the pattern of a triangle.

The three bellows 31 are respectively independently supplied with pressures of a gas or fluid from the pressurizing means. By providing a difference or differences between the pressures supplied respectively to the three bellows 31, so as thereby to change the expansion or contraction ratio of the bellows 31, the upper surface plate 30a can be inclined in any direction, whereby the inclination of the focusing stage 30 also can be adjusted.

Further, in the electron beam irradiation system according to the present embodiment, a measuring means 33 is provided on the side of the electron beam irradiation means 13, in correspondence with the master 1 and the focusing stage 30 on the support mechanism portion 2 as depicted in FIG. 2.

The measuring means 33 is for measuring the heights of the master 1 and the focusing stage 30, and is fixed on an outside wall surface of the vacuum chamber 14 of the electron beam irradiation means 13. As the measuring means, there may be used a high-precision measuring instrument such as an electrostatic capacity type sensor, an air micrometer, a laser measuring instrument and the like.

Subsequently, the flow of operations in the electron beam irradiation system according to the present embodiment which is provided with an electron beam focusing means constituted as above will be described.

In this system, first, the slide table 6 is moved to the left side in FIG. 2 by driving the motor 11, the master 1 is set on the turn-table 10, and is fixed in situ by the chucking means.

Here, since the electron beam irradiation system according to this embodiment is of a partial vacuum type, a vacuum suction system can be used as the chucking means, whereby it is easy to maintain the degree of flatness of the master 1.

Next, the height of the upper surface of the master 1 is measured by the measuring means 33 while moving the slide table 6 rightwards. Then, the slide table 6 is moved leftwards, and the height of the focusing stage 30 is adjusted to the same height as the upper surface of the master 1 while measuring the height of the focusing stage 30 by the measuring means 33.

Then, the slide table 6 is moved further leftwards to make the focusing stage 30 correspond to the electron beam irradiation portion, and, in this condition, the focusing stage 30 is irradiated with the electron beam, whereby the electron beam is focused.

The electron beam focusing operation is conducted while looking at a monitor connected to the electron gun 16 of the electron beam irradiation means 13. Namely, the minute pattern (See FIG. 4) of a lattice-like pattern or the like formed on the electron beam irradiation surface of the focusing stage 30 is displayed on the monitor, and the operator adjusts the electron gun 16 so as thereby to focus the electron beam while looking at the displayed pattern.

After the electron beam focusing operation is completed, the slide table 6 is moved to an electron beam irradiation starting position for the master, and recording by irradiation with the electron beam is started.

In this case, simultaneously with the irradiation with the electron beam, the master 1 is rotated by driving the motor 9 and the master 1 is moved in a radial direction by driving the motor 11, whereby recording on a predetermined track is performed.

After the recording is finished, the slide table 6 is moved to the left side, fixation of the master 1 on the turn-table 10 by vacuum suction is released, and the master 1 is taken out.

Thus, in the electron beam irradiation system according to the present embodiment, focusing of the electron beam can be easily performed.

Particularly in the electron beam irradiation system, the focusing stage 30 for focusing the electron beam is disposed adjacent to the master 1 on the slide table 6, and the distance between the focusing stage 30 and the master 1 is short, which is advantageous from the viewpoint of precision in adjusting the focusing stage 30 at the same height with the master 1. Accordingly, in the electron beam irradiation system, it is possible to focus the electron beam on the master 1 more accurately and, thereby, to achieve high-precision recording.

The present invention is not limited to the details of the above described preferred embodiments. The scope of the invention is defined by the appended claims, and all changes and modifications as fall within the equivalence of the scope of the claims are therefore to be embraced by the invention.

For example, the present invention can be applied to the case of an electron beam irradiation system according to the related art in which the entire body of the master 1 and the support mechanism portion 2 is maintained in a vacuum condition.

What is claimed is:

1. An electron beam irradiation system comprising:
   a support mechanism portion having a slide table for supporting a body to be irradiated with an electron beam so that said body to be irradiated can be moved linearly along a single axis, and
   an electron beam irradiation means for irradiating said body to be irradiated with said electron beam while partially establishing a vacuum condition on said body to be irradiated, wherein
   a focusing stage for focusing said electron beam is stationarily disposed on said slide table of said support mechanism portion at a position adjacent to said body to be irradiated.

2. An electron beam irradiation system as set forth in claim 1, wherein an electron beam irradiation surface of said focusing stage is provided with a lattice pattern.

3. An electron beam irradiation system as set forth in claim 1, wherein said focusing stage is provided with a height adjusting means for adjusting the height of said electron beam irradiation surface according to the thickness of said body to be irradiated.

4. An electron beam irradiation system as set forth in claim 3, wherein an expansion-contraction mechanism which is expanded and contracted by utilizing the pressure of a gas or fluid is used as said height adjusting means.

5. An electron beam irradiation system as set forth in claim 1, wherein a measuring means for measuring the heights of said body to be irradiated and said focusing stage is provided on the side of said electron beam irradiation means.

6. An electron beam irradiation system as set forth in claim 1, wherein said body to be irradiated is a master of optical disks.

7. An electron beam irradiation method using an electron beam irradiation system comprising:
   a support mechanism portion having a slide table for supporting a body to be irradiated with an electron beam so that said body to be irradiated can be moved linearly along a single axis, and
   an electron beam irradiation means for irradiating said body to be irradiated with said electron beam while partially establishing a vacuum condition on said body to be irradiated, wherein
   said electron beam is focused by irradiating with said electron beam a focusing stage stationarily disposed on said slide table of said support mechanism portion at a position adjacent to said body to be irradiated, thereafter said slide table is moved, and said body to be irradiated is irradiated with said electron beam.

8. An electron beam irradiation method as set forth in claim 7, wherein said body to be irradiated is a master of optical disks.

9. An electron beam irradiation system as set forth in claim 1, further comprising a turn-table, wherein said turn-table is between the body and the slide table, and the body is mounted on and supported by said turn-table.

10. An electron beam irradiation system as set forth in claim 7, further comprising a turn-table, wherein said turn-table is between the body and the slide table, and the body is mounted on and supported by said turn-table.

* * * * *